US008248183B2

(12) United States Patent

Syal

(10) Patent No.: US 8,248,183 B2

(45) Date of Patent: Aug. 21, 2012

(54) CIRCUIT BOARD PAD HAVING IMPEDANCE MATCHED TO A TRANSMISSION LINE AND METHOD FOR PROVIDING SAME

(75) Inventor: Ashish Syal, Vancouver (CA)

(73) Assignee: Sierra Wireless, Inc., Richmond (CA)

( * ) Notice: Subject to any disclaimer, the term of this patent is extended or adjusted under 35 U.S.C. 154(b) by 133 days.

(21) Appl. No.: 12/840,346

(22) Filed: Jul. 21, 2010

(65) Prior Publication Data

US 2011/0025429 A1 Feb. 3, 2011

Related U.S. Application Data

(60) Provisional application No. 61/229,938, filed on Jul. 30, 2009.

(51) Int. Cl.
*H03H 7/38* (2006.01)

(52) U.S. Cl. .......................................... 333/33; 333/238

(58) Field of Classification Search .................... 333/33, 333/34, 238, 246
See application file for complete search history.

(56) References Cited

U.S. PATENT DOCUMENTS

| | | | | |
|---|---|---|---|---|
| 3,815,055 | A * | 6/1974 | Plunk et al. | 333/128 |
| 6,348,844 | B1 * | 2/2002 | Albinsson et al. | 333/33 |
| 6,842,093 | B2 * | 1/2005 | Tamaki et al. | 333/260 |
| 7,106,145 | B2 * | 9/2006 | Hsu et al. | 333/34 |
| 7,339,260 | B2 | 3/2008 | Sugimoto et al. | |
| 7,385,459 | B2 * | 6/2008 | Duan et al. | 333/33 |
| 7,489,154 | B2 | 2/2009 | Tang | |
| 7,492,146 | B2 | 2/2009 | Behziz | |
| 2005/0237126 | A1 * | 10/2005 | Babb et al. | 333/34 |
| 2008/0042775 | A1 * | 2/2008 | Yang et al. | 333/34 |

OTHER PUBLICATIONS

Wheeler, Harold A., "Transmission—line properties of a strip on a dielectric sheet on a plane," Aug. 1977, IEEE Tran. Microwave Theory Tech., vol. MTT-25, pp. 631-647.

Application Note, "Optimizing Impedance Discontinuity Caused by Surface Mount Pads for High-Speed Channel Designs," May 2008, Altera Corporation, Serial No. AN-530-1.0.

Wadell, Brian C., "Transmission Line Design Handbook," 1991, Artech House, pp. 93-111.

Maloratsky, L., "Reviewing the Basics of Microstrip Lines," Mar. 2000, Microwaves & RF Magazine, pp. 79-88.

Satrom, R., "High Frequency Signal Integrity Issues in Semiconductor Test," Mar. 8, 2005, ECT-Semiconductor Test Group, MN, Presentation, Burn-in & Test Socket Workshop.

* cited by examiner

*Primary Examiner* — Stephen Jones

(74) *Attorney, Agent, or Firm* — Swanson & Bratschun, L.L.C.

(57) ABSTRACT

The present invention provides a transmission line portion for a circuit board including a conductive strip and a pad portion including a conductive pad connected to the conductive strip, wherein an impedance discontinuity or mismatch between the transmission line portion and the pad portion is reduced or controlled. Impedance discontinuity or mismatch may be controlled by controlling the dimensions of the pad portion, for example the pad width or distance between pad and ground. A ground pad associated with the pad portion may be provided on a different layer than a ground plane of the transmission line portion. The ground pad and ground plane may be connected by vias. The ground pad may comprise a patterned conductive region, the pattern configured so as to desirably configure impedance of the pad portion. Also provided are a method, circuit board layout, and the like, related to the above.

9 Claims, 6 Drawing Sheets

CIRCUIT BOARD PAD HAVING IMPEDANCE MATCHED TO A TRANSMISSION LINE AND METHOD FOR PROVIDING SAME

FIELD OF THE INVENTION

The present invention pertains in general to circuit board design and in particular to circuit boards and methods for matching impedance between a transmission line element and a conductive pad connected thereto.

BACKGROUND

Circuit boards, such as multilayer printed circuit boards (PCBs), are widely used in the electronics industry. PCBs typically comprise one or more layers having conductive traces etched onto them, the various layers separated by a dielectric material, with interconnections possible between layers, for example using through-holes or vias. Circuit board design and production is often subject to various, often conflicting, requirements, such as demand for products which are compact, operate at high-speeds, have low costs, and have high reliability. Meeting these requirements presents an ongoing challenge for the industry.

Transmission lines, such as microstrip or striplines, are often used to reliably route high-frequency signals, such as microwave signals, from one area of a PCB to another. Such transmission lines comprise a conductive strip or signal trace separated from one or more ground planes by one or more dielectric layers. Theoretically, signals in such transmission lines propagate as an electromagnetic wave existing at least partially in the one or more dielectric layers.

It is often desirable to make electrical contact with points along a transmission line, for example by using a spring-loaded probe pin to contact the signal trace of a microstrip transmission line on the outer layer of a PCB. Such probing may be required when testing the circuit board for quality control or other analysis purposes, for example. However, for small signal traces, it may be difficult to guide the probe pin with sufficient accuracy to contact the signal trace, which may result in circuit test failures or other problems.

One solution to the above-mentioned problem is to provide an enlarged conductive pad at one or more locations along the signal trace to facilitate ease of electrical contact. However, the impedance of the enlarged pad typically will not match the impedance of the rest of the transmission line to which it is connected. This impedance mismatch or discontinuity may affect signal propagation through the transmission line, resulting in partial signal reflection, power loss, signal degradation, and/or general distortion, which may impact circuit performance. This can be particularly problematic at high signal frequencies. These effects last the lifetime of the circuit, whereas the test pad may only be used once or twice during manufacture.

The impedance of a transmission line or associated feature can be altered by changing its size and shape. For example, capacitance to ground can be changed by altering the dimensions of the trace or feature, and by changing the distance from the trace or feature to ground. For example, a formula expressing a relationship between impedance, feature width and dielectric thickness of microstrip transmission lines is given in "Transmission-line properties of a strip on a dielectric sheet on a plane," by Harold A. Wheeler in IEEE Tran. Microwave Theory Tech., vol. MTT-25, pp. 631-647, August 1977. One property of this formula is that increasing the width of a trace or feature results in a decrease in characterstic impedance. Another property is that increasing the distance of the trace or feature to the ground plane results in an increase in characteristic impedance. However, mere knowledge of the relationships between dimensions and impedance of a feature does not necessarily lead to appropriate recognition of, or solution to, the above-mentioned problems related to impedance discontinuity or mismatch.

In an application note entitled "Optimizing Impedance Discontinuity Caused by Surface Mount Pads for High-Speed Channel Designs," published by Altera Corporation, May 2008, Serial No. AN-530-1.0, a plane cutout method is disclosed for reducing impedance discontinuities between a high-speed data channel and either DC blocking capacitor pads or surface-mount technology (SMT) pads of Subminiature A (SMA) coaxial connectors. It is proposed to compensate for an impedance discontinuity due to sudden widening of high-speed traces into capacitor or SMT pads by removing a portion of the ground reference plane directly beneath the pads. The appropriate portion of ground plane to remove is determined by simulation trial and error. In the area where the ground reference plane is removed, the signal is said to reference a ground plane further away. However, there is no discussion of the configuration or location of this further ground plane.

Therefore there is a need for circuit board elements and associated methods for matching impedance between a transmission line element and a conductive pad connected thereto that is not subject to one of more limitations of the prior art.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a circuit board pad having an impedance matched to a transmission line, and a method for providing same. In accordance with an aspect of the present invention, there is provided, a transmission line element for a circuit board, the transmission line element comprising a transmission line portion including a conductive strip, a ground plane, and a first dielectric region, the conductive strip having a first width, the first dielectric region separating the conductive strip and the ground plane by a first distance; and a pad portion including a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance; wherein the pad portion is configured to provide an impedance characteristic generally matched with a corresponding impedance characteristic of the transmission line portion.

In accordance with another aspect of the present invention, there is provided a method for providing a transmission line element for a circuit board, the method comprising providing a transmission line portion including a conductive strip, a ground plane, and a first dielectric region, the conductive strip having a first width, the first dielectric region separating the conductive strip and the ground plane by a first distance; providing a pad portion including a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance; and configuring the pad portion to provide an impedance characteristic generally matched with a corresponding impedance characteristic of the transmission line portion.

DETAILED DESCRIPTION OF THE INVENTION

Definitions

Figure 1A:
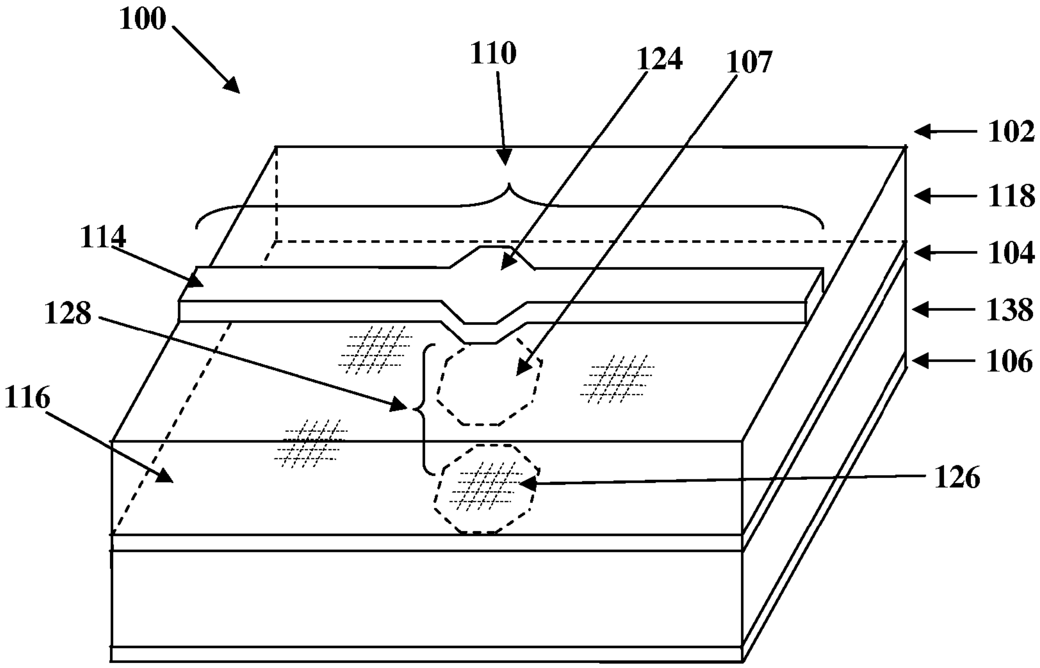
FIG. 1A illustrates a perspective view of a portion of a printed circuit board in accordance with an embodiment of the present invention.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

The present invention provides, in a circuit board such as a PCB, a transmission line portion including a conductive strip, and a pad portion including a pad, such as a test pad, connected to the conductive strip, wherein an impedance characteristic discontinuity or mismatch between the transmission line portion and the pad portion is reduced or controlled. The transmission line portion and the pad portion may be generally referred to as a transmission line element. Also provided are a method, circuit board layout, and the like, related to providing the above.

In some aspects, the transmission line portion includes a conductive strip, a ground plane, and a first dielectric region, the conductive strip having a first width, and the first dielectric region separating the conductive strip and the ground plane by a first distance. The pad portion includes a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance. Impedance characteristics of the pad portion may be controllably configured by configuring at least the width of the conductive pad, the distance between the conductive pad and the ground pad, or a combination thereof. Other means for configuring impedance characteristics of the pad portion, the transmission line portion, or a combination thereof, are disclosed herein.

In some embodiments, the ground pad of the pad portion comprises a patterned conductive region, the pattern covering at least a portion of the ground pad area. Characteristics of the patterned conductive region may be configured to desirably modify characteristics of the ground pad and hence impedance characteristics of the pad portion. This can facilitate reduction or control of characteristic impedance discontinuity or mismatch between transmission line portion and pad portion. This may also facilitate control of other impedance characteristics of the pad portion. For example, a patterned conductive region may be provided on the ground pad to affect its capacitance in comparison to a ground pad without a patterned conductive region of otherwise same dimensions. Accordingly, a patterned conductive region may be configured to reduce the capacitance of the ground pad.

For example, the patterned conductive region may comprise a cross-hatched pattern of conductive traces, wherein the ratio of conductor-covered area to ground pad area is less than 1. Moreover, in some embodiments, characteristics of the patterned conductive region may vary across its extension, whereas in a PCB, the conductive pad and the ground pad are typically confined to predetermined planar layers of the PCB and hence the distance therebetween may not vary. Therefore, varying characteristics of the patterned conductive region may facilitate fine-tuning of impedance characteristics. This approach may facilitate fine-tuning of impedance, for example when only a discrete set of standard pad sizes is available for use on a PCB, or when pads are confined to discrete PCB layers of predetermined thickness.

More generally, aspects of the present invention provide for a transmission line element having two or more regions. In accordance with embodiments of the present invention, each region of the transmission line element is differentiated from at least one adjacent region with respect to the dimensions or the patterning of the transmission line features or both. Dimensions or patterning of the transmission line features may include the separation between the conductive trace and the ground plane, width or thickness of conductive trace, thickness of ground plane, or the like. Aspects of each region of the transmission line element are configured to reduce impedance mismatch and/or to reduce impedance discontinuities between adjacent regions of the transmission line element. Impedance may be real, complex, or imaginary characteristic impedance, for example.

A transmission line portion may also include a dielectric slot defined by one or more edges of one or more conductive regions which may be disposed in one or more layers. The one or more conductive regions may be adjacent and/or galvanically coupled. The slot may be an empty depression devoid of conductive material within an otherwise conductive layer or the slot may be filled with dielectric material. Impedance characteristics of a slot may be determined by configuring at least width, depth, and/or the material with which the slot is filled, or other properties of the circuit board, for example. Slots may be used in electric circuits for high speed, high frequency, and/or microwave applications, for example.

In some embodiments, the ground pad of the pad portion is electrically coupled to the ground plane of the transmission line portion using one or more cross-layer conductive connectors such as vias, blind vias, buried vias, through-holes, or the like. For example, this allows localized ground pads to assume a defined electrical potential, as opposed to reliance on the existence of plural ground planes over possibly wide areas, thus providing for more flexible circuit board design.

Variation of Distance to Ground

Figure 1B:
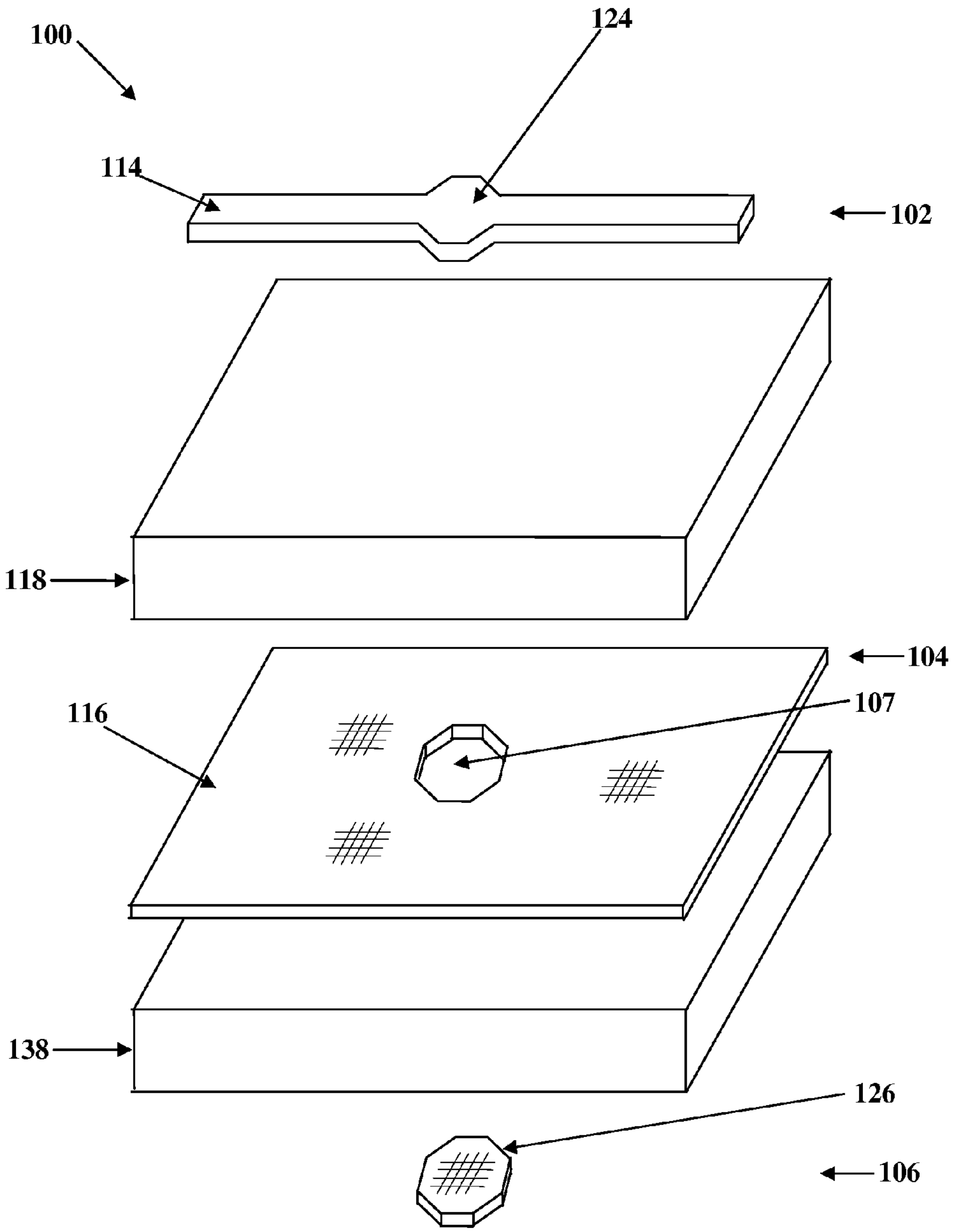
FIG. 1B illustrates an exploded view of the printed circuit board portion of FIG. 1A, in accordance with an embodiment of the present invention.

FIG. 1A illustrates a perspective view of a PCB 100 including a transmission line element 110. FIG. 1B illustrates an exploded view of the same PCB 100. In FIG. 1A, broken lines are used to illustrate selected aspects of hidden features. Patches of cross-hatching are used to indicate some regions of conductive material. Referring now to both FIGS. 1A and 1B, the PCB includes at least three generally planar layers 102, 104 and 106 on which conductive features may be formed. Layers 102 and 104 are separated by dielectric layer 118; layers 104 and 106 are separated by dielectric layer 138. The transmission line element 110 includes a transmission line portion and a pad portion. The transmission line portion includes a conductive strip 114, also referred to as a signal trace, a ground plane 116, and a dielectric layer 118 therebetween. The pad portion includes a conductive pad 124, such as a test pad for receiving a test pin, a ground pad 126, and dielectric 128 therebetween. As illustrated, dielectric 128 comprises circuit board dielectric layers 118 and 138.

As illustrated, the conductive strip 114 and conductive pad 124 both reside on the same layer 102. The ground plane 116 is situated on layer 104, whereas the ground pad 126 is situated on layer 106. Thus, the ground pad 126 is farther from the conductive pad 124 than the ground plane 116 is from the conductive strip 114. To facilitate this arrangement, there is provided an aperture 107 in the ground plane 116, generally in the region of the pad portion.

Figure 3A:
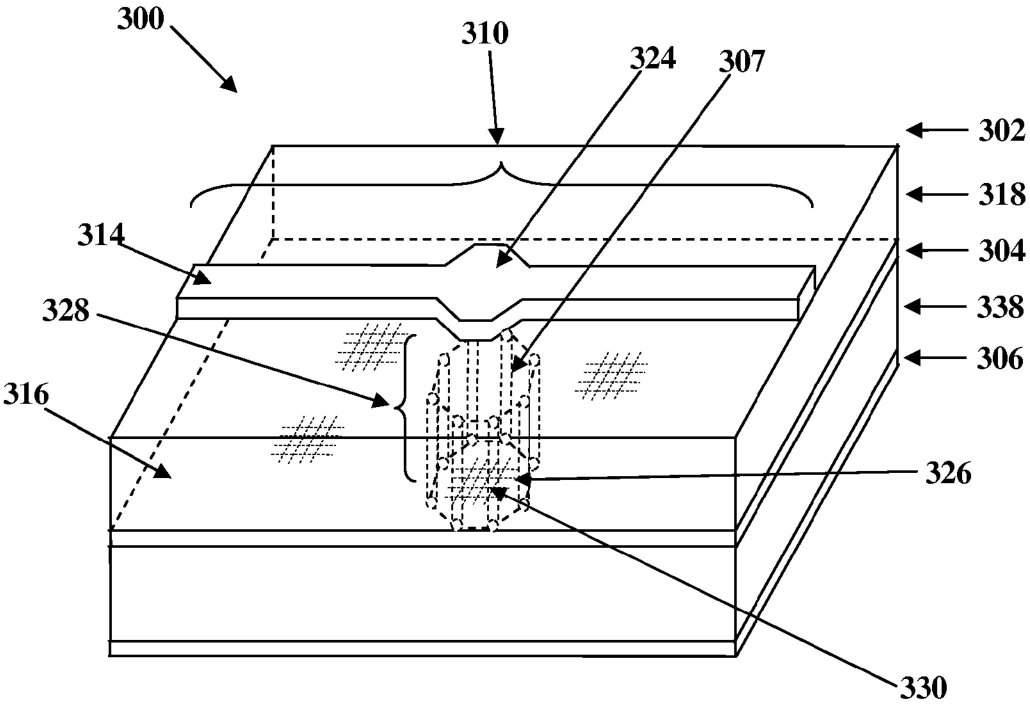
FIG. 3A illustrates a perspective view of a portion of a printed circuit board in accordance with an embodiment of the present invention.
Figure 3B:
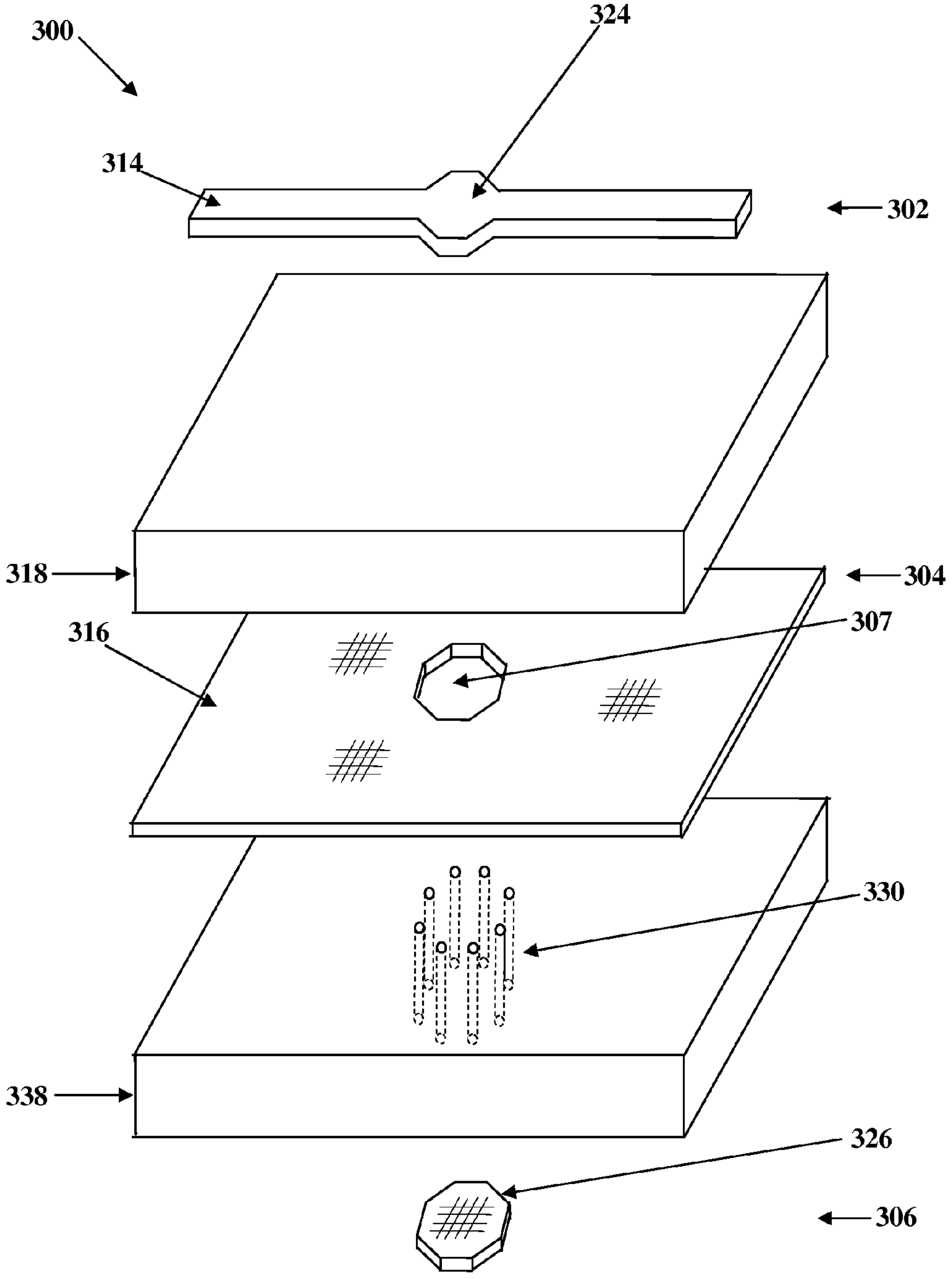
FIG. 3B illustrates an exploded view of the printed circuit board portion of FIG. 1A, in accordance with an embodiment of the present invention.

Although there is no explicitly illustrated connection of the ground pad 126 to ground, this may be provided in various ways. For example, the ground pad 126 may be connected via a signal trace to a grounded element on layer 106 or on another layer. As illustrated in FIGS. 3A and 3B, the ground pad 126 may be connected using one or more vias to the ground plane 116. In some embodiments, the ground pad may be capacitively coupled to a ground such as ground plane 116. For example, the ground pad 126 may be extended to include a section parallel to the ground plane 116, thereby providing a capacitative coupling therebetween. Other means to connect the ground pad 126 to ground by resistive, capacitative, or inductive coupling, or combinations thereof, may also be used.

Example equations for determining impedance of microstrips are given in *Transmission Line Design Handbook*, by Brian C Wadell, Artech House, 1991, and attributable to "Transmission-line properties of a strip on a dielectric sheet on a plane", by Harold A. Wheeler in IEEE Tran. Microwave Theory Tech., vol. 25, Issue 8, pp. 631-647, August 1977. The equations can be used to determine a characteristic impedance $Z_0$ of a two-layered feature, such as a transmission line portion or pad portion of a PCB separated by a dielectric having a relative dielectric constant, to its dimensions, including feature width, dielectric thickness, and conductor thickness.

A further example equation for determining a quasi-static characteristic impedance of a microstrip line is given by H. A. Wheeler, "Transmission-line properties of a strip on a dielectric sheet on a plane", IEEE Tran. Microwave Theory Tech., vol. MTT-25, pp. 631-647, August 1977. The quasi-static characteristic impedance of a microstrip $Z_{microstrip}$ can be estimated as follows:

$$Z_{microstrip} = \frac{z_0}{2\pi\sqrt{2(1+\varepsilon_r)}} \ln\left(1 + \frac{4h}{w_{eff}}\left(\frac{14+\frac{8}{\varepsilon_r}}{11}\frac{4h}{w_{eff}} + \sqrt{\left(\frac{14+\frac{8}{\varepsilon_r}}{11}\frac{4h}{w_{eff}}\right)^2 + \pi^2\frac{1+\frac{1}{\varepsilon_r}}{2}}\right)\right) \quad (1)$$

wherein:

$$w_{eff} = w + t\frac{1+\frac{1}{\varepsilon_r}}{2\pi}\ln\left(\frac{4e}{\sqrt{\left(\frac{t}{h}\right)^2 + \left(\frac{1}{\pi}\frac{1}{\frac{w}{t}+\frac{11}{10}}\right)^2}}\right)$$

wherein $Z_0$ represents impedance of free space, $\in_r$ the dielectric constant of the substrate, w the width of the strip, h the thickness/height of substrate, and t the thickness of strip metallization. It is noted that the formula for $Z_{microstrip}$ is asymptotically exact if, for example, firstly w is substantially larger than h, which may be referred to as a parallel plate transmission line, secondly if w is substantially smaller than h and if $\in_r=1$, which may be referred to as a wire above a ground plane, and thirdly if w is substantially smaller than h and when $\in_r$ is substantially larger than 1. It is further noted that for a substantial number of configurations, the accuracy of equation (1) is +/−1%, and always better than 2%. Further approximate formulas have been developed by other authors. However, most of these are applicable to only a limited range of aspect-ratios, or else cover the entire range piecewise.

Figure 2:
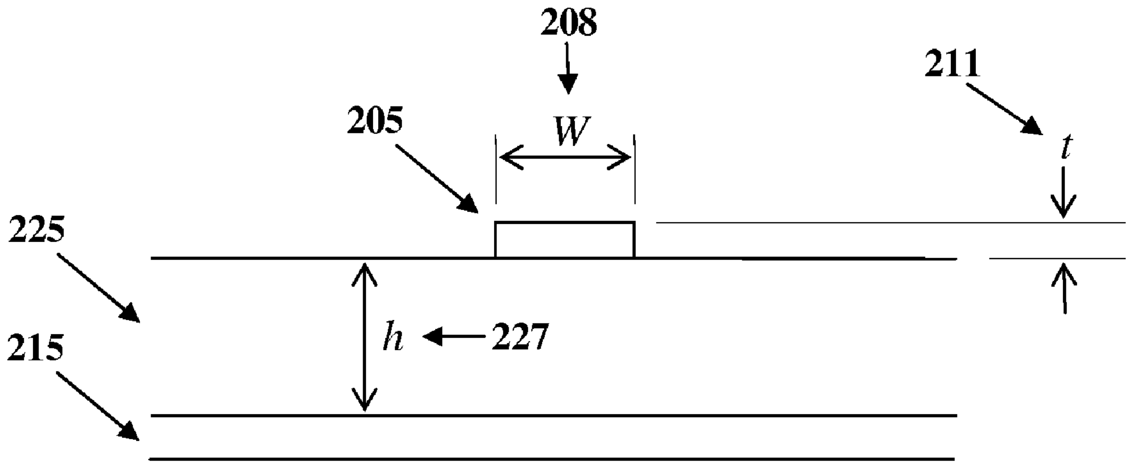
FIG. 2 illustrates a side view of a printed circuit board feature in accordance with an embodiment of the present invention.

FIG. 2 illustrates the dimensional input variables w, t, and h of Equation (1), by way of a side view of a feature 205 separated from a ground plane 215 by a dielectric layer 225 having a relative dielectric constant $\in_r$. The feature 205 has width W 208 and conductor thickness t 211. The dielectric has thickness h 227.

One property of Equation (1) is that increasing the width of a trace or feature by a factor of k results in a decrease in characteristic impedance, but this effect can be offset by increasing the distance to ground by roughly the same factor k. This property may be identified by the repeated appearance of the ratio W/h or its inverse, or the related ratio W'/h (where W' is interpreted as the width of a thin (t→0) feature which would theoretically operate equivalently to the feature 205). This property may be used in the present invention to facilitate impedance matching or reduction of impedance discontinuity between a transmission line portion and a pad portion. For example, if a conductive pad has a width k times that of an adjacent transmission line conductive strip connected thereto, then providing a separation between conductive pad and ground pad which is about k times the separation between transmission line conductive strip and ground plane, may generally compensate for the change of impedance due to the wider conductive pad, thereby providing a roughly matched impedance between transmission line portion and pad portion. Fine-tuning of the impedance match may also be performed by further adjusting various dimension parameters or other feature parameters, as described herein.

In some embodiments, the dimensions of the ground pad or ground plane, such as width, length, or thickness, may be changed to control impedance. In some embodiments, the dielectric properties in regions of the transmission line may also vary. However, it may be difficult or expensive to controllably vary properties such as relative dielectric constant.

Via-Connected Ground Pad

FIG. 3A illustrates a perspective view of a PCB 300 including a transmission line element 310. FIG. 3B illustrates an exploded view of the same PCB 300. In FIG. 3A, broken lines are used to illustrate selected aspects of hidden features. Patches of cross-hatching are used to indicate some regions of conductive material. Referring now to both FIGS. 3A and 3B, the PCB includes at least three generally planar layers 302, 304 and 306 on which conductive features may be formed. Layers 302 and 304 are separated by dielectric layer 318; layers 304 and 306 are separated by dielectric layer 338. The transmission line element 310 includes a transmission line portion and a pad portion. The transmission line portion includes a conductive strip 314, also referred to as a signal trace, a ground plane 316, and a dielectric layer 318 therebetween. The pad portion includes a conductive pad 324, such as a test pad for receiving a test pin, a ground pad 326, and dielectric 328 therebetween. As illustrated, dielectric 328 comprises circuit board dielectric layers 318 and 338.

As illustrated, the conductive strip 314 and conductive pad 324 both reside on the same layer 302. The ground plane 316 is situated on layer 304, whereas the ground pad 326 is situated on layer 306. Thus, the ground pad 326 is farther from the conductive pad 324 than the ground plane 316 is from the conductive strip 314. To facilitate this arrangement, there is provided an aperture 307 in the ground plane 316, generally in the region of the pad portion.

In contrast to FIGS. 1A and 1B, FIGS. 3A and 3B explicitly illustrate electrical connection of the ground pad 326 to the ground plane 316 by a plurality of vias 330 passing at least between PCB layer 304 and PCB layer 306. The vias can be disposed in an array, matrix or other regular or irregular fashion. The vias 306 as illustrated do not reach PCB layer 302, and are thus blind vias (if PCB layer 306 is the bottom layer of the PCB) or buried vias (if PCB layer 306 is an internal layer of the PCB).

The electrical connection between ground plane 316 and ground pad 326 using vias 330 facilitates operation of the ground pad 316 as a signal reference plane to signals passing through the conductive pad 324. The electrical connection provides a substantial connection of the ground pad 326 to ground, which facilitates signal transmission as would be readily understood by a worker skilled in the art. Moreover, the ground pad 326 and ground plane 316 are held at a substantially common ground potential, thereby facilitating signal transmission at both the transmission line portion and the pad portion.

The vias 330 follow a relatively short path from ground pad 326 to an appropriate ground reference, provided by ground plane 316. Use of vias 330 therefore results in relatively efficient use of resources on the PCB 300. For example, the present configuration avoids requiring a substantial ground path or ground plane to be provided on PCB layer 306, which might otherwise require more area than the ground pad 326. Additionally, as it is unlikely that signal traces or components will be placed within the dielectric layer 328, provision of vias 330 will typically be possible without interference with other traces or components.

In some embodiments, some or all of the vias 330 may provide an inductive or capacitative coupling between ground pad 326 and ground plane 316, instead of or in addition to a resistive coupling. For example, a via may not provide a continuous path of conductive material between ground pad 326 and ground plane 316, but may nonetheless provide a coupling between the two features, as would be readily understood by a worker skilled in the art. Vias 330 may be configured in association with other features such as conductive traces, other vias, ground planes, patterned features, or the like, to provide a coupling between ground pad 326 and ground plane 316 having a desired impedance. For example, different vias may be disposed at different radial distances from the center of the ground pad.

Patterned Ground Pad

Figure 4:
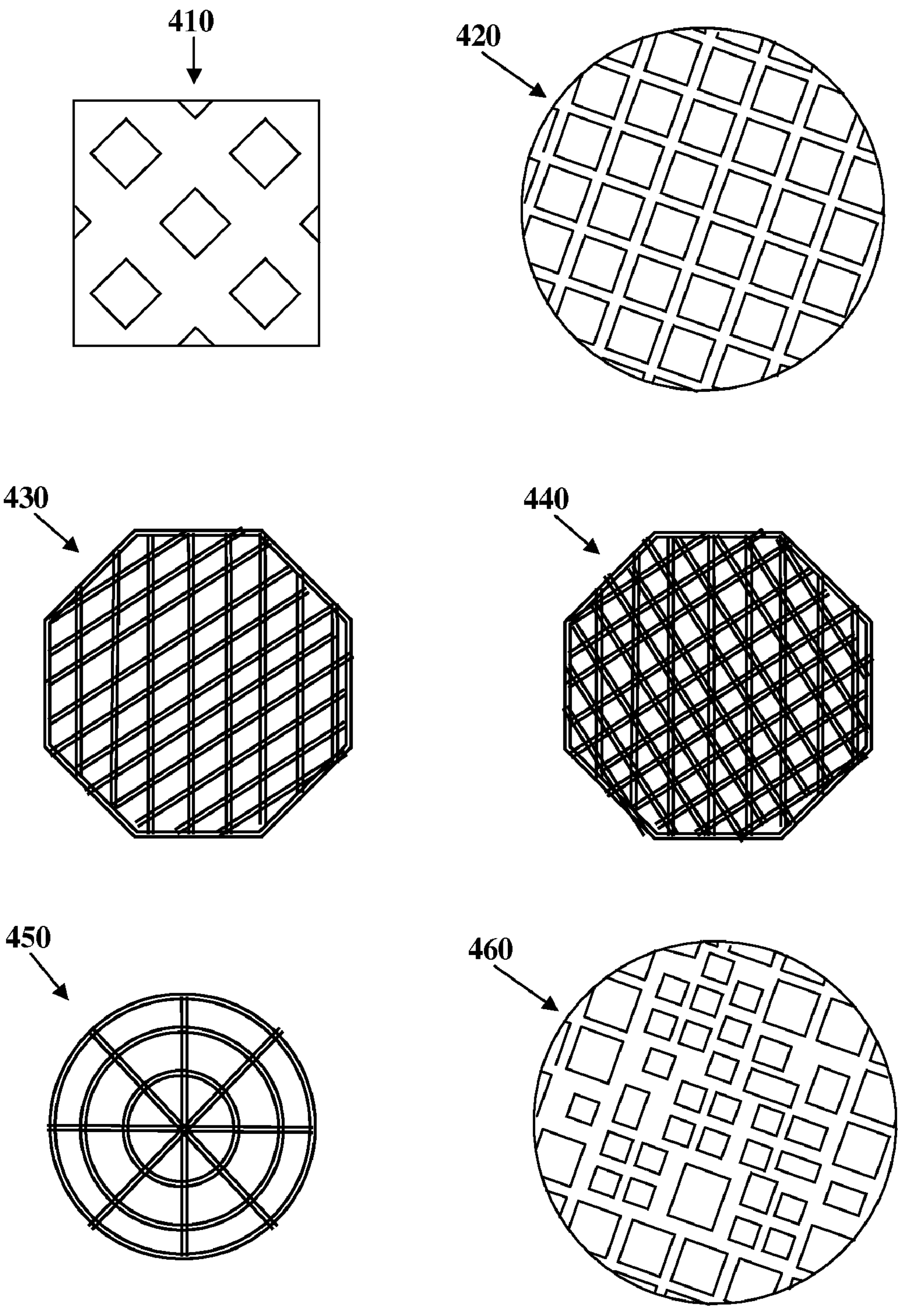
FIG. 4 illustrates various ground pads comprising patterns of conductive traces, in accordance with various embodiments of the present invention.

FIG. 4 illustrates several ground pads 410, 420, 430, 440, 450 and 460, each comprising a pattern of conductive traces. Pad 410 illustrates a cross-hatched pattern of relatively wide conductive traces intersecting at right angles. Pad 420 illustrates a cross-hatched pattern of somewhat thinner conductive traces, again intersecting at right angles. Pad 430 schematically illustrates a pattern of conductive traces intersecting at an oblique angle. Pad 440 schematically illustrates another pattern of conductive traces intersecting at a combination of right angles and oblique angles. Pad 450 schematically illustrates another pattern of conductive traces, including generally circular traces intersecting generally straight traces. Pad 460 illustrates another pattern of conductive material, having substantially irregularly configured square or rectangular areas. In pads 410, 420, 430, 440, 450 and 460, the conductive material or traces are connected, whereas the non-conductive regions are separated from each other. Areas in between a pattern of conductive traces may be substantially free of conductive material or partially filled with conductive material at depressed levels.

Another approach to defining the pattern of conductors is by defining the size, shape, and arrangement of apertures formed in the pattern, wherein the apertures essentially define areas of the pad that are substantially free or depleted of conductive material. For example, a cross-hatched pattern of equally sized and spaced conductive traces intersecting at right angles may also be described as an array of square apertures, the apertures having side lengths equal to the spacing between adjacent conductive traces, adjacent aperture centers being separated by a distance equal to the distance between adjacent conductor centers.

Cross-hatching of conductive areas on a PCB layer, such as a ground plane, is known in the prior art and may be performed for one or more reasons. For example, to avoid mechanical problems such as lifting of large conductive planes from the PCB or PCB twisting or warping, to reduce heat sinking tendencies of the conductive area during component soldering, to economize use of metallic conductor, or the like. However, cross-hatching in high-frequency or high-performance circuitry is generally thought to degrade circuit performance, and is thus often cautioned against or avoided. Embodiments of the present invention at least in part involve the realization that judicious cross-hatching or other patterning may be used advantageously, particularly to modify impedance characteristics of the pad portion by cross-hatching of at least a portion of the ground pad. Impedance characteristics may include one or more of: characteristic impedance of the ground portion, and capacitance of the ground pad. Patterning results in a ground pad comprising connected conductive regions defining one or more apertures which may be substantially free of conductive material.

As illustrated in FIG. 4, by varying pattern parameters such as conductor trace width, spacing between adjacent conductive traces, angle between intersecting conductive traces, and the like, the ratio of ground pad area covered by conductive material to total ground pad area can be adjusted. This ratio can be referred to as a "fill ratio", and is hereinafter referred to as the pattern density of the ground pad. Similarly, the ratio of conductive material on a feature to the total feature area is referred to as the pattern density of that feature. Varying the pattern density of the ground pad or conductive pad may affect the impedance of the pad portion, for example the characteristic impedance. For example, again referring to FIG. 4, the pattern density of pad 410 is about 78%, and the pattern density of pad 420 is about 35%.

It is noted that pattern density may not be the only pattern property affecting characteristic impedance. For example, width of pattern features, size, shape and orientation of non-conductive regions, and the like, may also be of importance in this regard. Therefore, it may be advantageous to consider the overall pattern configuration or features thereof, such as trace width, trace spacing, trace length, trace shape, and the like.

As can be seen from Equation (1), impedance of a feature is related not only to feature width and distance between feature and ground, but also the thickness of conductive layer of which the feature and ground are made. Therefore, varying the pattern density of a feature such as a ground pad may in some cases be related to varying the average conductive layer thickness of that feature. For example, if the pattern density of a ground pad is 50%, and the conductor thickness is q, then the impedance can be roughly calculated by taking the ground pad conductor thickness to be 0.5q. In other cases, the relationship between pattern density q and effective conductor thickness c may be approximated by a linear relationship c=mq+b for some constants m and q, by a nonlinear relationship c=ƒ(q), for some (for example monotone) function ƒ, or by a piecewise combination of such relationships. The relationship between pattern density and effective conductor thickness may also be subject to other pattern features, such as trace width, trace spacing, trace length, trace shape, non-conductive region size and shape, distribution of differently sized and shaped features, and the like. In some embodiments, the relationship may also be frequency dependent.

More generally, the complex-valued impedance or characteristic impedance of the pad portion may be modelled as a function of one or more pattern features. Other characteristics affecting impedance, such as dielectric constant $\in_r$, pad width W, dielectric thickness h, and pad thickness t, as in Equation (1), may be viewed as parameters or variables in such a model. For example, pad portion characteristic impedance Z may be modelled as a function of pattern features such as pattern density p, aperture size a, and the like. The model may be mathematically expressible for example as Z=f(p,a). Such a model may be developed by theoretical means, experimental means, simulation means, or a combination thereof. A model may be a mathematical model, computer simulation model, geometrical model, look-up table model, or another type of model relating impedance characteristics with pattern features. Impedance may also be frequency dependent, size and/or scale dependent, or the like. For example, average characteristic impedance of a patterned feature may be determined for the feature as a whole, or for different portions of the feature. Statistical analysis may be performed to determine aspects such as variation in characteristic impedance over feature portions of a predetermined size.

In embodiments of the present invention, appropriate pattern features may be developed by trial and error, or by a combination of trial and error and knowledge of relationships between pattern features and impedance characteristics. For example, trace width, pattern density, and aperture geometry of a cross-hatched pattern may be varied and evaluated through experimentation or simulation to determine a relationship between these features and impedance of the pad portion. For example, evaluation may comprise time-domain reflectometry (TDR), or other techniques as would be readily understood by a worker skilled in the art. Complex characteristic impedance measurements for various experimental configurations may be interpolated or extrapolated, curve-fitted, or otherwise used to parameterize or expand a modelled inter-relationship between pattern features and impedance.

In some embodiments, the pattern used in providing a patterned conductive surface may be configured to exhibit one or more desired properties in addition to providing a desired pattern density. For example, a larger number of narrower traces, or a smaller number of wider traces may be used in a pattern. Combinations of large and small traces may also be used, as may combinations of curved and straight traces, long and short traces, and the like.

In some embodiments, a larger number of narrower traces may provide substantially the same pattern density as a smaller number of wider traces, but with smaller gaps between conductive and non-conductive regions of the pad. In some cases, this may desirably reduce variation in the pad, thereby affecting signal propagation.

In some embodiments, a smaller number of wider traces may provide substantially the same pattern density as a larger number of narrower traces, but the overall impedance of the two configurations may differ, due to considerations such as total surface area, cross-sectional area of the traces, skin effect, and the like. In addition, narrower traces may also have a larger percentage of error based on fabrication tolerances.

In some embodiments, the configuration of the apertures free of conductive material, formed due to patterning, may affect signal transmission characteristics through the pad portion. For example, electromagnetic "leakage" may occur through apertures of the ground pad. In some embodiments, this leakage may be frequency dependent for a given aperture size. Aperture sizes may thus be configured to result in a desired amount of electromagnetic leakage as a function of signal frequency.

In some embodiments, the angle between patterned conductors of the ground pad and the direction of signal propagation may affect characteristics related so signal propagation through the pad portion, for example characteristic impedance thereof.

In some embodiments, a ground pad may be patterned to provide a lower capacitance to the transmission line, the conductive pad, the ground plane, or a combination thereof, or other elements of a circuit board, for example. Patterning may reduce the amount of conductive surface of the ground pad, thereby reducing capacitance introduced thereby. The pattern of the ground pad may be configured, as described herein, to provide a desired capacitance in circuit operation.

A pattern defined on the ground pad may be configured to provide a desired trade-off between or combination of desired characteristics of the patterned feature. For example, the pattern may be configured to provide a predetermined overall impedance related to the feature, as well as a desired level of variation in impedance at different locations of the feature, and a desired level of signal leakage or signal containment. In addition, pattern complexity or trace width may be configured to provide a desired level of feature complexity or simplicity. For example, adequately simple features or adequately wide traces, or both, may be desirably used to aid in manufacturing of the pattern by etching processes as would be readily understood by a worker skilled in the art, for example by photolithography, silk screening, milling, or the like.

It is contemplated that the above-described approach related to patterning of the ground pad may also be performed on the ground plane. That is, the impedance of a transmission line portion may be varied to match the impedance of a ground pad by adjusting the pattern density of the ground plane.

While the present invention has been described primarily with respect to microstrip transmission lines, it is contemplated that aspects of the invention may also be applied to other types of transmission lines. For example, aspects of the present invention may be applied to microstrip, suspended microstrip, inverted microstrip, shielded microstrip, stripline, double-conductor stripline, shielded high-Q suspended stripline, shielded suspended stripline, shielded suspended double-substrate stripline, slotline, antipodal slotline, bilateral finline, symmetrical coplanar line, shielded coplanar waveguide, finline, bilateral slotline, antipodal finline, and antipodal overlapping finline transmission lines, or combinations thereof, or the like.

EXAMPLE

In an exemplary embodiment of the present invention, a microstrip transmission line is provided on the top layer of a circuit board, the transmission line comprising a 1.46 mm wide and 0.1 mm thick conductive trace overtop of a ground plane on a lower layer of the circuit board. The conductive trace and ground plane are separated by a dielectric having thickness 0.8 mm and relative dielectric constant $\in_r$=4.2. In accordance with Equation (1), a characteristic impedance of about 50.3 Ohms can be calculated for the example transmission line.

During functional or in-circuit testing of the circuit board (for example populated or unpopulated with electronic components), it is often necessary to probe the circuit board at several locations. Probing may comprise electrical contact of a spring-loaded test probe to the transmission line conductive trace at one or more predetermined locations, as would be readily understood by a worker skilled in the art. In-circuit test platforms currently offered for sale are provided by various companies such as Agilent™, Genrad™, Teradyne™, SPEA™, Digitaltest™, and SEICA™. Since the conductive trace is relatively narrow (1.46 mm wide), it may be desirable or necessary to provide a relatively wide test pad at the location of the transmission line where probe contact is to occur. This facilitates reliable electrical contact of the probe for test purposes.

For example, a conductive test pad of width 3.5 mm may be designed into the printed circuit board of the present example at a predetermined location along the transmission line, on the same layer thereof. If no change is made to the ground plane, the characteristic impedance at this relatively wider test pad is changed to about 28.61 Ohms. This impedance mismatch, or substantially abrupt change in impedance, may undesirably affect operation of the transmission line, for example by causing signal distortion due to signal reflection, power loss, signal degradation, and the like.

To address the impedance mismatch, an aperture can be formed in the ground plane below the test pad, and a ground pad may be formed on the next lower layer of the circuit board. The aperture and ground pad may be about the same size as the test pad. The ground pad may further be electrically connected to the ground plane by one or more vias, which may be disposed around the perimeter of the aperture, for example. Assuming each layer of the circuit board has substantially the same separation, the distance between test pad and ground pad will be 1.6 mm. It is often not feasible to adjust separation of circuit board layers to satisfy just one design requirement, without adversely affecting other requirements. The characteristic impedance of the pad may be again approximately determined by Equation (1) to be about 46.13 Ohms. The impedance mismatch is therefore substantially reduced.

Although the impedance mismatch has been reduced, there is still a mismatch of about 50.3−46.13=4.17 Ohms, or about 8.3%. To further reduce the impedance mismatch, the test pad size may be reduced. For example, a test pad width of 3.027 mm will result in a characteristic impedance of about 50.3 Ohms. However, in some instances this may inhibit ability to contact the test probe to the test pad. Another approach to reduce the impedance mismatch is to provide a patterned ground pad. For example, instead of a ground pad formed of a solid portion of conductive material such as copper or aluminum, the ground pad may comprise a cross-hatched pattern of conductive material.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

I claim:

1. A transmission line element for a circuit board, the transmission line element comprising:

a) a transmission line portion including a conductive strip, a ground plane, and a first dielectric region, the conductive strip having a first width, the first dielectric region separating the conductive strip and the ground plane by a first distance; and b) a pad portion including a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance;

wherein the pad portion is configured to provide an impedance characteristic generally matched with a corresponding impedance characteristic of the transmission line portion, and wherein the conductive pad is a test pad configured to provide an electrical connection for an external probe for circuit testing.

2. The transmission line element according to claim 1, wherein the ground pad comprises a patterned conductive region, and wherein configuration of the pad portion includes configuration of one or more characteristics of the patterned conductive region.

3. The transmission line element according to claim 1, further comprising one or more conductive connectors for providing a predetermined electrical coupling between the ground pad and the ground plane.

4. The transmission line element according to claim 3, wherein one or more or the conductive connectors are configured as vias.

5. A circuit board comprising a transmission line element the transmission line element comprising:

a) a transmission line portion including a conductive strip, a ground plane, and a first dielectric region, the conductive strip having a first width, the first dielectric region separating the conductive strip and the ground plane by a first distance; and b) a pad portion including a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance;

wherein the pad portion is configured to provide an impedance characteristic generally matched with a corresponding impedance characteristic of the transmission line portion, and wherein the conductive pad is a test pad configured to provide an electrical connection for an external probe for circuit testing.

6. A method for providing a transmission line element for a circuit board, the method comprising:

a) providing a transmission line portion including a conductive strip, a ground plane, and a first dielectric region, the conductive strip having a first width, the first dielectric region separating the conductive strip and the ground plane by a first distance;

b) providing a pad portion including a conductive pad electrically coupled to the conductive strip, the conductive pad having a width greater than said first width, the pad portion further including a ground pad and a second dielectric region, the second dielectric region separating the conductive pad from the ground pad by a second distance greater than said first distance; and configuring the pad portion to provide an impedance characteristic generally matched with a corresponding impedance characteristic of the transmission line portion, wherein the conductive pad is a test pad configured to provide an electrical connection for an external probe for circuit testing.

7. The method according to claim 6, wherein the ground pad comprises a patterned conductive region, and wherein configuring the pad portion includes configuration of one or more characteristics of the patterned conductive region.

8. The method according to claim 6, further comprising providing one or more conductive connectors for providing a predetermined electrical coupling between the ground pad and the ground plane.

9. The method according to claim 6, wherein one or more of the conductive connectors are configured as vias.

* * * * *